(12) United States Patent
Kim et al.

(10) Patent No.: US 7,548,086 B2
(45) Date of Patent: Jun. 16, 2009

(54) IMPEDANCE CONTROL CIRCUIT IN SEMICONDUCTOR DEVICE AND IMPEDANCE CONTROL METHOD

(75) Inventors: Tae-Hyoung Kim, Seongnam-si (KR); Ji-Suk Kwon, Seoul (KR); Uk-Rae Cho, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 44 days.

(21) Appl. No.: 11/417,970

(22) Filed: May 4, 2006

(65) Prior Publication Data

US 2006/0261844 A1    Nov. 23, 2006

(30) Foreign Application Priority Data

May 11, 2005    (KR) .................... 10-2005-0039153

(51) Int. Cl.
*H03K 17/16*    (2006.01)
*H03K 19/003*    (2006.01)
*H03K 5/12*    (2006.01)

(52) U.S. Cl. ........................... 326/30; 326/83; 327/170
(58) Field of Classification Search .................. 326/30
See application file for complete search history.

(56) References Cited

U.S. PATENT DOCUMENTS

| | | | |
|---|---|---|---|
| 5,834,860 A | 11/1998 | Parsons et al. ............... 307/98 |
| 6,222,389 B1 | 4/2001 | Williams ..................... 326/86 |
| 6,307,424 B1* | 10/2001 | Lee ........................... 327/530 |
| 6,459,320 B2* | 10/2002 | Lee ........................... 327/310 |
| 6,751,782 B2 | 6/2004 | Levin et al. .................... 716/1 |
| 6,812,734 B1 | 11/2004 | Shumarayev et al. ......... 326/30 |
| 2002/0063576 A1* | 5/2002 | Kim et al. ..................... 326/30 |
| 2004/0119497 A1* | 6/2004 | Roy et al. ..................... 326/50 |

\* cited by examiner

*Primary Examiner*—Rexford N Barnie
*Assistant Examiner*—Dylan White
(74) *Attorney, Agent, or Firm*—F. Chau & Associates, LLC

(57) ABSTRACT

An impedance control circuit includes an impedance detector, an output driver and an impedance controller. The impedance detector generates a first output value to a detection pad connected between an external determination resistor and a pull-up transistor array, and outputs a second output value to a resistance divider terminal commonly connected between a pull-up and pull-down transistor array in response to a pull-up control code data and a pull-down control code data. The output driver has a commonly connected pull-up and pull-down transistor array, and a compensating unit connected to the pull-up and pull-down transistor array of the output driver, to compensate for quantization error of the pull-up and pull-down control code data. The impedance controller performs a comparison and counting operation so that the first and second output values of the impedance detector become approximated to a predetermined reference value, and generates the pull-up and pull-down control code data.

15 Claims, 7 Drawing Sheets

IMPEDANCE CONTROL CIRCUIT IN SEMICONDUCTOR DEVICE AND IMPEDANCE CONTROL METHOD

CROSS-REFERENCE TO RELATED PATENT APPLICATION

This application claims priority to Korean Patent Application No. 2005-0039153, filed on May 11, 2005, in the Korean Intellectual Property Office, the disclosure of which is incorporated by reference herein.

BACKGROUND OF THE INVENTION

1. Field of the Invention

The present invention relates to a field of impedance control for semiconductor devices, and more particularly, to an impedance control circuit and method in a semiconductor device, capable of reducing an impedance mismatch.

2. Discussion of the Related Art

A semiconductor device typically includes pins to transmit and send data to and from other devices, and a data output circuit which functions as a data output buffer and a driver circuit to provide internal data to external devices. As an example, the pins may be connected to a transmission line such as printed wiring provided on a mounting substrate, in a semiconductor device incorporated into an electrical appliance. The pins are required to charge or discharge a floating capacitance or load capacitance (parasitic capacitance) existing on the mounting substrate. Matching an output impedance to an impedance of a transmission line should achieve the optimum transmission of an output signal. Matching an input impedance to the impedance of a transmission line should achieve the reception of input signals without distortion. The former is known to those in the art as an output impedance (ZQ) control and the latter is known as a chip termination(ZT) control. Generally the output impedance control is performed for an output driver and the chip termination control is performed for an input terminator.

An increasing trend in the field of electrical appliances is to decrease a swing width of a signal interfaced between semiconductor devices, thereby substantially reducing a delay time which occurs during the transfer of the signal. However, when the swing width of the signal is reduced, an influence of external noise increases, and a reflection of the output signal caused by impedance mismatch degrades the signal. Impedance mismatch can be caused by a number of factors, including external noise, or variations in power source voltage, operating temperatures and fabricating processes, etc. When output impedance(ZQ) or chip termination(ZT) controls are not performed properly, impedance mismatch occurs and both transmitted and received signals may be distorted, causing a number of potential problems. As an example, when a semiconductor device receives a distorted output signal through a receiver, a setup/hold fail or a decision error from improper input level may occur Thus, some semiconductor memory devices have employed a programmable impedance control scheme to perform input/output impedance matching with external semiconductor devices. U.S. Pat. No. 6,307,424, discloses a programmable impedance control (PIC) circuit to perform programmable impedance control.

When performing impedance control with a High Speed Transceiver Logic (HSTL) interface, one extra pin is used to produce an output impedance within dozens of ohms of a desired value. In a semiconductor memory device employing such a scheme, it is frequently difficult to obtain and adaptively correct a precise output impedance value, due to many conditions such as varying power source voltages, operating temperatures, and manufacturing processes. U.S. Pat. No. 6,456,124 discloses a variable impedance control method.

In high-speed data transmission, as data transmission rates increase, so do the requirements for an on-chip termination. In the on-chip termination, a source termination is performed in an output driver(Dout) side, and a parallel termination is performed in a receiver side. TA signal can be transferred in a full swing even though the swing level of the signal is reduced, and so an effect of a reflected signal is reduced and integrity of the signal is improved.

A termination circuit, or terminator, can be created by using a parallel-sum impedance of a composed transistor array, the transistor array being constructed of a plurality of pull-up and pull-down transistors. A median signal is produced by pull-up resistance and pull-down resistance of the terminator, but a receiver recognizes the signal by using a separate reference voltage. When a mismatch of pull-up and pull-down resistances occurs within the transistor array of the terminator, the median signal is changed, having an adverse effect on a setup/hold window of the receiver.

In a prior art, there is an impedance mismatch of a 1-bit resolution between pull up and down resistances which limits the reduction in impedance mismatch that can occur. The prior art will be described in reference to FIGS. 1-3 as follows.

FIG. 1 is a block diagram illustrating a conventional impedance control circuit in a semiconductor device. FIG. 2 illustrates circuit blocks of FIG. 1 in greater detail. FIG. 3 illustrates an example of impedance mismatch between pull up and down resistance shown in FIG. 2.

FIG. 1 illustrates a circuit with an impedance detector 200, an impedance controller 100 and a driver 300. The driver 300 may comprise an output driver or a terminator. As shown in the circuit of FIG. 2, the impedance detector 200 outputs a pull-up output value XZQ in response to a pull-up control code data P<n:0>, to a detection pad connected between an external determination resistor RQ and a pull-up transistor array P1-P4, and outputs a pull-down output value DZQ to a resistance divider terminal commonly connected between pull-up and pull-down transistor arrays P10, P20-P40, N10 and N20-N40 in response to the pull-up control code data P<n:0> and the pull-down control code data N<n:0>.

The driver 300 includes the same transistor arrays P11, P21-P41 and N11, N21-N41 as the pull-up and pull-down transistor arrays of the impedance detector 200, and is selectively turned on in response to substantially the same pull-up control code data p<n:0> and pull-down control code data n<n:0> as the above pull-up control code data P<n:0> and pull-down control code data N<n:0>.

The impedance controller 100 performs a comparison on the pull-up and pull-down output values, the comparison used to adjust a counter which outputs the pull-up and pull-down control code data so that the pull-up output value and pull-down output value of the impedance detector 200 is adjusted to a value approximate to a predetermined reference value, e.g., half a power source voltage, and generates the pull-up control code data P<n:0> and the pull-down control code data N<n:0>. The impedance controller 100, functioning as a ZQ/ZT controller, properly controls the pull-up control code data P<n:0> and the pull-down control code data N<n:0>. Transistors within the pull-up and the pull-down transistor arrays are enabled or disabled based on the control code data, thereby adjusting a resistance value of the impedance detector 200 to closely approximate a resistance RQ within a range of resolution. The pull-up control code data p<n:0> and the pull-down control code data n<n:0> input to the driver 300, have the same value as data applied to the impedance detector 200, and the corresponding resistance value of the output driver 300 has the same resistance value as a resistance value of the impedance detector 100.

P-type MOS transistors P1-P4 within the pull-up transistor array shown in the upper side of FIG. 2 are selectively turned on or off by the pull-up control code data P<n:0>, and a parallel synthesis resistance value obtained through the turned-on transistors becomes approximated to the external determination resistance(RQ) value. The control by the pull-up control code data P<n:0> employs a digital control scheme causing quantization error. In generating the pull-up control code data, the impedance controller 100 selects a code to provide a resistance value less than the reference resistance value, as the pull-up control code data P<n:0>, so that the parallel synthesis resistance value becomes approximated to the predetermined reference resistance value or a target resistance value. The pull-up control code data P<n:0> is copied intact as a control code data P<n:0> for controlling pull-up transistors P10-P40 of the pull-up transistor array connected to a pull-down output terminal DZQ. The impedance controller 100 outputs a control code data N<n:0> and controls a pull-down resistance, on the basis of the pull-up resistance value provided by the pull-up control code data P<n:0>, so that transistors N10-N40 within an N-type transistor array positioned under the output terminal DZQ are turned on or off. Consequently, this is to provide a reference voltage to the output terminal DZQ. In generating the pull-down control code data, a code representing a resistance value greater than the reference resistance value is selected by the impedance controller 100.

In the circuit of FIG. 2, an impedance mismatch between pull-up and pull-down resistances may have a value corresponding to a maximum 1-bit resolution as shown in FIG. 3. FIG. 3 illustrates a maximum range of pull-up and pull-down impedance mismatch. Using a pull-up output value XZQ as a target level, each 0.5-bit difference is shown in + and − directions. Thus a pull-down output value DZQ#1 has an upper maximum 1-bit difference, and a pull-down output value DZQ#2 has a lower maximum 1-bit difference.

Consequently, when a mismatch between pull-up and pull-down resistances occurs, transmission error of output signals occurs or a median input signal is changed, potentially causing a setup/hold fail in a receiver.

SUMMARY OF THE INVENTION

An exemplary embodiment of the present invention provides an impedance control circuit of semiconductor device and an impedance control method, through which an impedance mismatch between pull-up and pull-down resistances can be reduced without increasing a resolution. Furthermore, a mismatch between pull-up and pull-down resistances reduced by half a digital control resolution within pull-up and pull-down transistor arrays, thus transmission error of an output signal or a setup/hold fail in a receiver can be improved.

According to an exemplary embodiment of the invention, an impedance control circuit in a semiconductor device comprises an impedance detector, an output driver, and an impedance controller. The impedance detector outputs a first output value to a detection pad connected between an external determination resistor and a pull-up transistor array in response to a pull-up control code data, and outputs a second output value to a resistance divider terminal commonly connected between a pull-up transistor array and a pull-down transistor array in response to the pull-up control code data and a pull-down control code data. The output driver has a resistance divider terminal commonly connected between a pull-up transistor array and a pull-down transistor array, and a compensating unit. The compensating unit is connected to a node between the pull-up transistor array and the pull-down transistor array of the output driver, to compensate for quantization error of the pull-up and pull-down control code data. The impedance controller performs a comparison on the first and second output values, the comparison used to adjust a counter which outputs the pull-up and pull-down control code data so that the first and second output values of the impedance detector become approximated to a predetermined reference value.

The compensating unit of the output driver may be connected in parallel to the pull-down transistor array or the pull-up transistor array, and a resistance value of the compensating unit may be twice a unit resistance value of a transistor array. When the first and second output values individually indicate a voltage level provided by a parallel synthesis resistance value of the pull-up and pull-down transistor arrays, the predetermined reference value may be half a power source voltage.

The impedance controller may select a code to represent a resistance value less than a reference resistance value for generating the pull-up control code data when the compensating unit is connected in parallel to a pull-down transistor array, and may select a code to represent a resistance value greater than the reference resistance value for generating the pull-down control code data.

According to another exemplary embodiment of the invention, an impedance control method in a semiconductor device comprises preparing an output driver, the output driver includes an impedance detector for generating first and second detection voltages and a mismatch compensating unit connected in parallel with a transistor array the same as a transistor array of the impedance detector and a pull-down transistor array of the transistor array; and selecting a first code representing a resistance value less than a reference resistance value for generating a pull-up control code data, and selecting a second code representing a resistance value greater than the reference resistance value for generating a pull-down control code data, so that the first and second detection voltages of the impedance detector become approximated to a predetermined reference voltage value.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
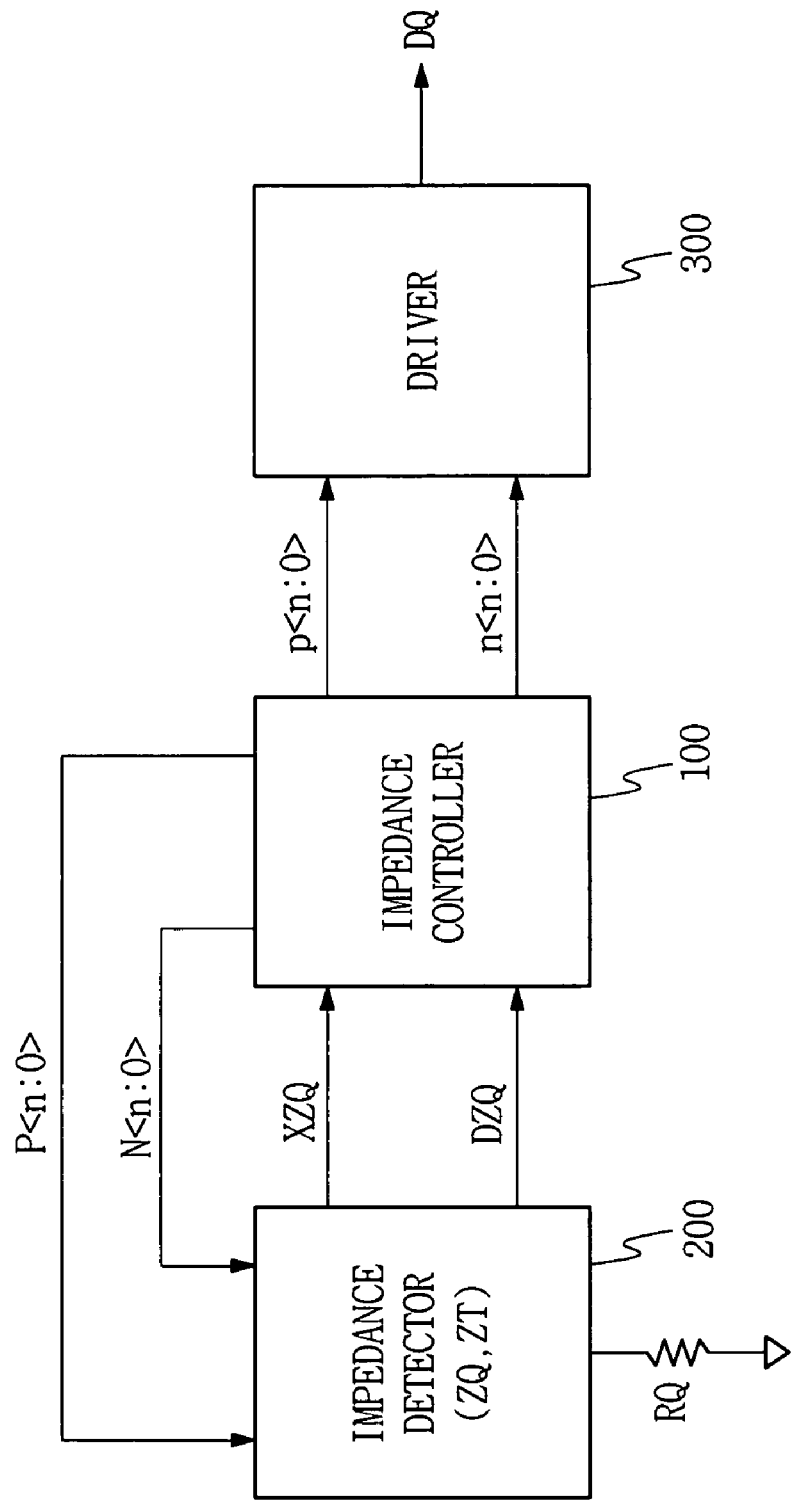
FIG. 1 is a block diagram of a conventional impedance control circuit in a semiconductor device.
Figure 2:
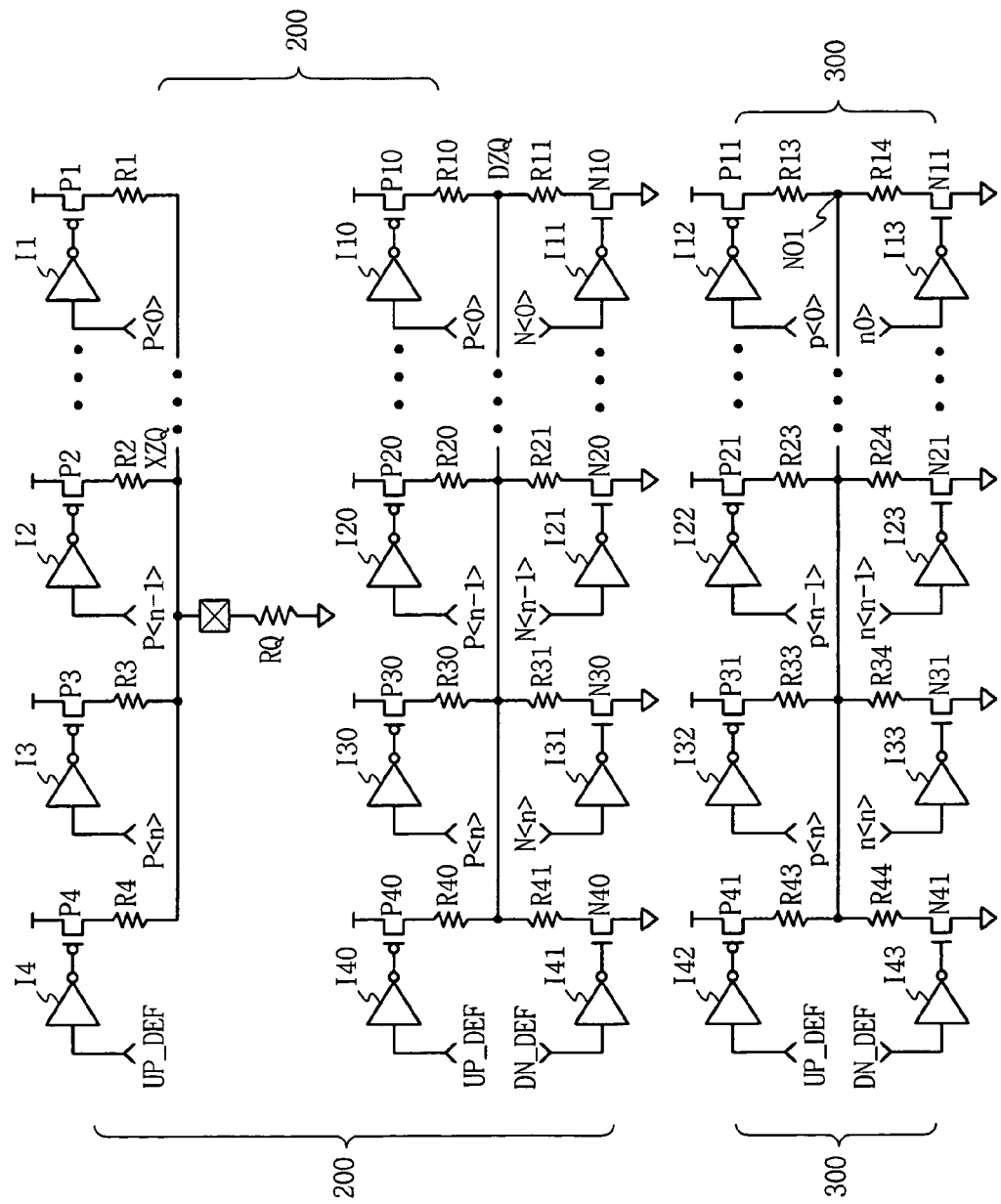
FIG. 2 is a circuit diagram illustrating in detail circuit blocks of FIG. 1.

Hereinafter, exemplary embodiments of the present invention will be described in detail with reference to the attached drawings. Like reference numerals in the drawings denote like elements.

Figure 4:
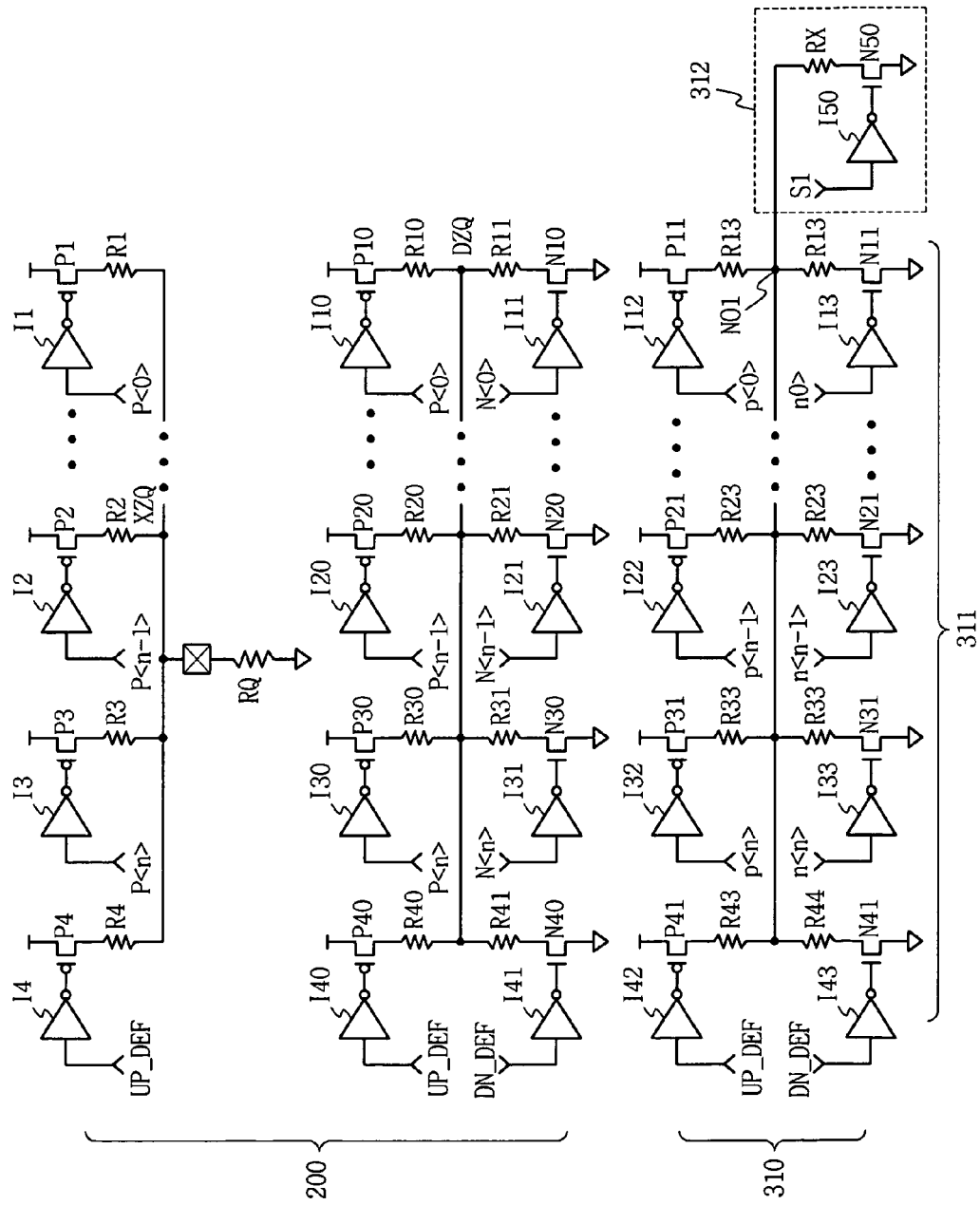
FIG. 4 is a circuit diagram illustrating an exemplary embodiment of the invention.

FIG. 4 is a circuit diagram illustrating an exemplary embodiment of the invention. An impedance detector 200 outputs a pull-up output value XZQ to a detection pad connected between an external determination resistor RQ and a pull-up transistor array P1-P4 in response to a pull-up control code data P<n:0>, and outputs a pull-down output value DZQ to a resistance divider terminal commonly connected between pull-up and pull-down transistor arrays P10, P20-P40 and N10, N20-N40 in response to the pull-up control code data P<n:0> and the pull-down control code data N<n:0>.

A driver 310 functioning as an output driver or terminator includes transistor arrays P11, P21-P41 and N11, N21-N41 the same as the pull-up and pull-down transistor arrays of the impedance detector 200. Transistors within the transistor array 311 are selectively turned on in response to the pull-up control code data p<n:0> and pull-down control code data n<n:0> substantially same as the above pull-up control code data P<n:0> and the pull-down control code data N<n:0>.

The driver 310 includes a compensating unit 312 connected to the transistor array 311, to compensate for quantization error of pull-up control code data P<n:0> and pull-down control code data N<n:0>. The compensating unit 312 includes an inverter I50 for driving a selection signal S1, a pull-down transistor N50 whose gate is connected to an output of the inverter I50, and a resistance RX connected between a drain of the pull-down transistor N50 and a node NO1 of the transistor array 311. The resistance RX is twice a unit resistance value of the transistor array 311, e.g., a determined resistance value of resistance R13, so that an impedance mismatch between pull-up and pull-down resistances does not exceed a maximum half bit error.

The impedance controller 100 from FIG. 1 may be used to generate the pull-up control code data P<n:0> and pull-down control code data N<n:0> shown in FIG. 4. The impedance controller 100 includes a comparator and counter so that the pull-up output value and the pull-down output value of the impedance detector 200 can be approximated to a predetermined reference value, e.g., half a power source voltage. The impedance controller 100 also includes an upper code selector and a lower code selector, to select upper data and lower data among current control code data and previously latched control code data generated by a counting operation of the counter.

In FIG. 4, when the impedance controller 100 selects a first code representing a resistance value less than the reference resistance value, as the pull-up control code data P<n:0>, and a second code representing a resistance value greater than the reference resistance value, as the pull-down control code data N<n:0>, an impedance mismatch between pull-up and pull-down resistances is cut in half without increasing a resolution, by using the compensating unit 312 connected to the driver 310.

Figure 3:
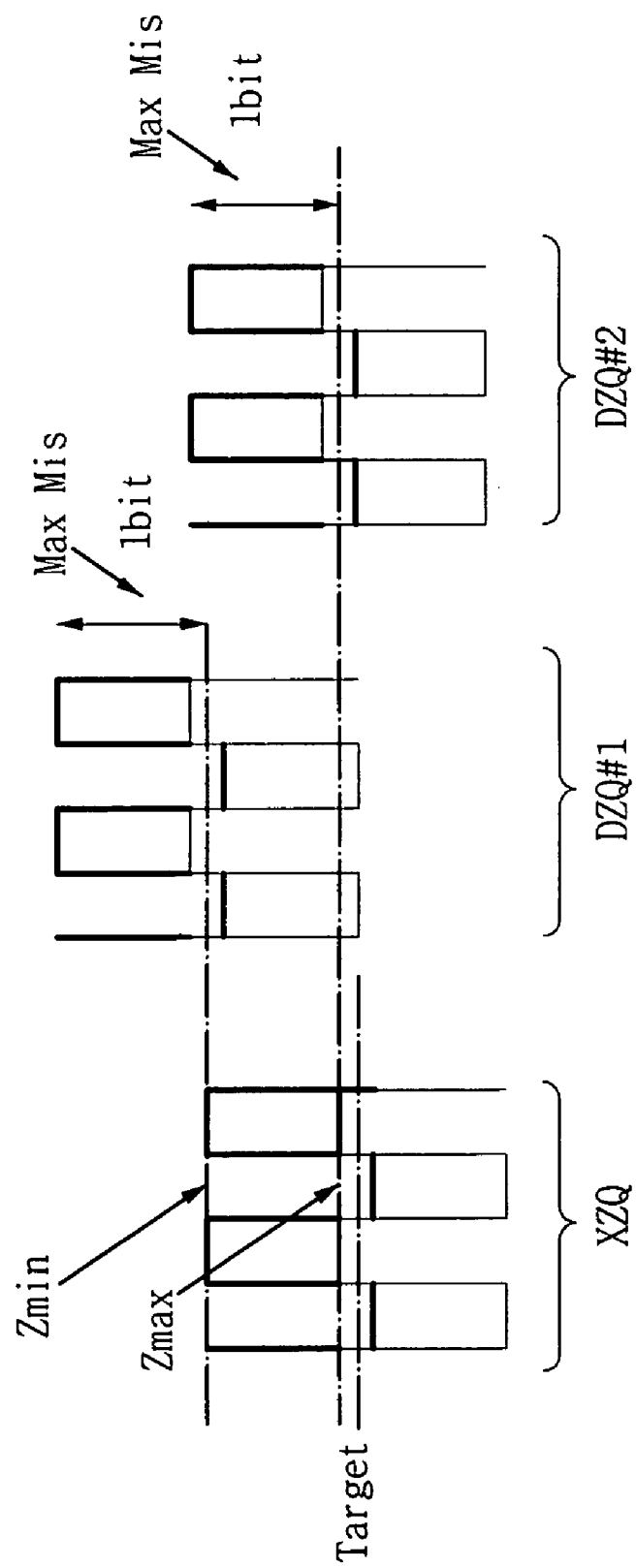
FIG. 3 illustrates an example of pull-up and pull-down impedance mismatch shown in FIG. 2.
Figure 5:
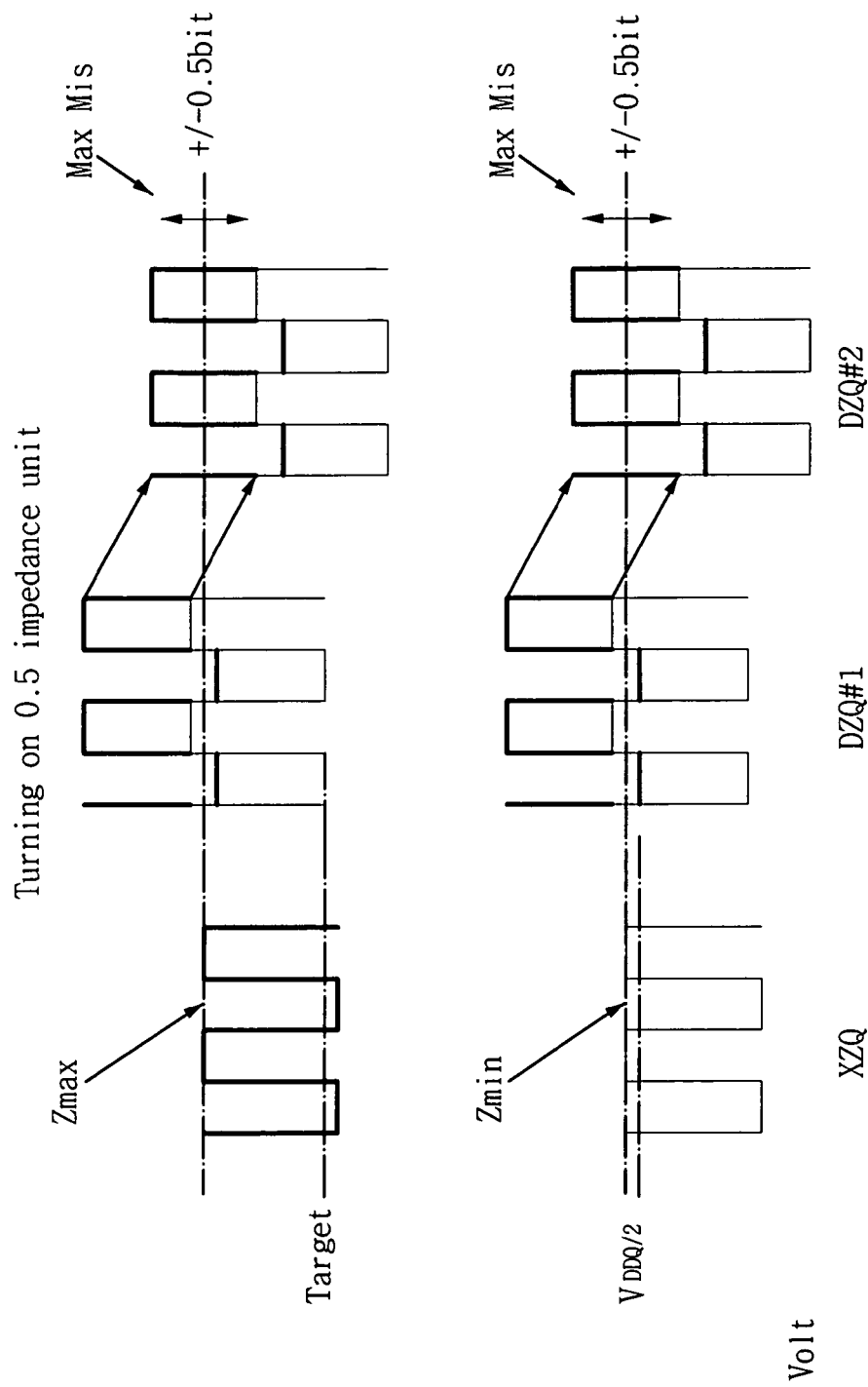
FIG. 5 illustrates an example of reduced pull-up and pull-down impedance mismatch referred to in FIG. 4.

FIG. 5 illustrates an example of a reduced pull-up and pull-down impedance mismatch referred to in FIG. 4. Using a pull-up output value XZQ as a target level, each 0.5-bit difference is shown in a + and − direction. A pull-down output value DZQ#1 has an upper maximum 1-bit difference, but a bit shifting of each 0.5-bit is generated in the target level direction along the arrow mark shown in the upper part of the drawing, by operation of the compensating unit 312 connected to the driver 310. Thus, a mismatch of pull-up and pull-down resistance values has each a 0.5 bit difference in a + and − direction on the basis of a maximum level Zmax. In comparing that with FIG. 3, error is reduced by 0.5 bit.

The pull-down output value DZQ#2 has an upper maximum 1-bit difference, but a bit shifting of each 0.5 bit is generated in a reference level direction as a half power source voltage along the arrow mark shown in the lower part of the drawing, by operation of the compensating unit 312 connected to the driver 310. Thus, a mismatch of pull-up and pull-down resistance values has each a 0.5 bit difference in a + and − direction on the basis of a minimum level Zmin. In comparing that with FIG. 3, error is also reduced by 0.5 bit.

An impedance mismatch between pull-up and pull-down resistances, based on quantization, is reduced by 0.5 bit as compared with the conventional impedance matching device. Thus, a median signal can be produced more precisely, and an adverse effect on a setup/hold window of a receiver can be reduced.

Figure 6:
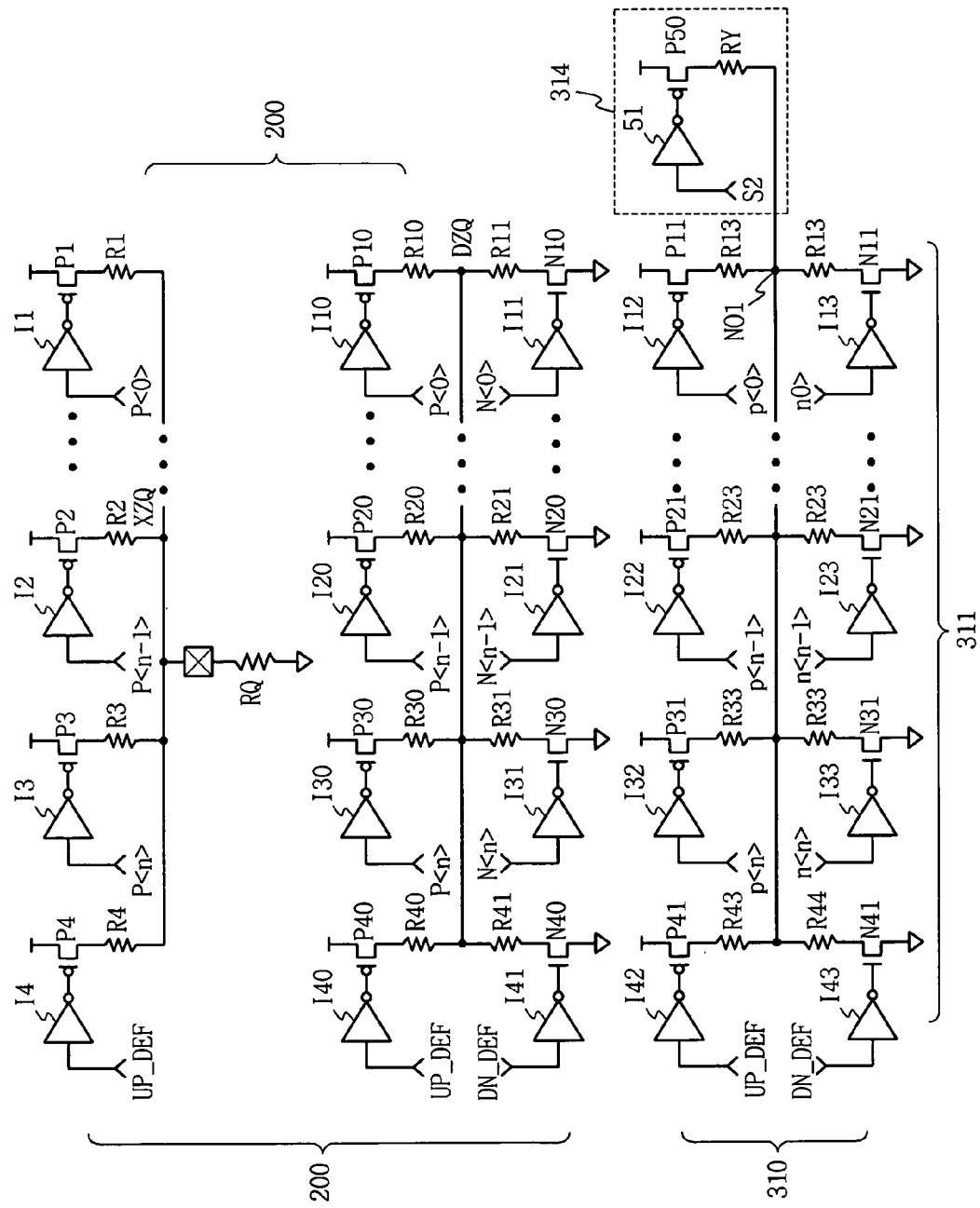
FIG. 6 is a circuit diagram illustrating an exemplary embodiment of the invention.

FIG. 6 is a circuit diagram illustrating an exemplary embodiment of the invention. With reference to FIG. 6, the detailed configuration of an impedance detector 200 is the same as that of FIG. 4, and a pull-up transistor array within the driver 310 is connected in parallel to a compensating unit 314. The compensating unit 314 includes an inverter 51, a pull-up transistor P50, and a resistor RY. The inverter 51 is for driving a selection signal S2. A gate of the pull-up transistor P50 is connected to an output of the inverter 51. The resistor RY is connected between a drain of the pull-up transistor P50 and a node NO1 of the transistor array 311. The resistance RY is twice a unit resistance value within the transistor array 311, e.g., a determined resistance value of the resistance R13.

In FIG. 6, a first code representing a resistance value greater than the reference resistance value is selected as the pull-up control code data P<n:0>, and a second code representing a resistance value less than the reference resistance value is selected as the pull-down control code data N<n:0>. The pull-up and pull-down impedance mismatch is reduced by a 0.5 bit resolution by using the compensating unit 312.

Figure 7:
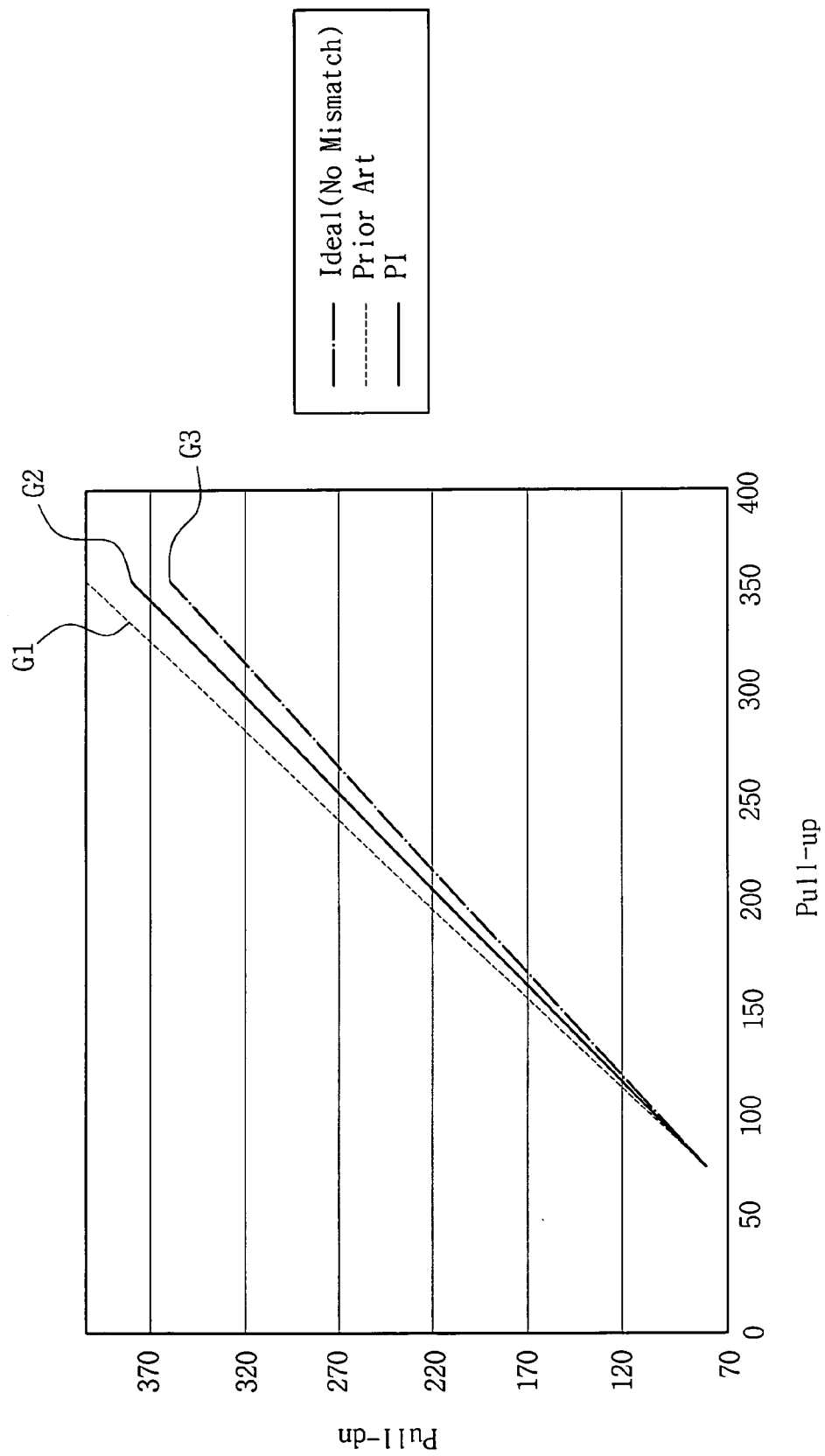
FIG. 7 is a graph illustrating an impedance matching correlation between pull-up and pull-down resistors.

FIG. 7 is a graph illustrating an impedance matching correlation between pull-up and pull-down resistances. A horizontal axis indicates a pull-up resistance, and a vertical axis indicates a pull-down resistance. A graph G1 is according to a prior art, a graph G2 is according to an exemplary embodiment of the invention, and a graph G3 is an ideal graph not having mismatch. The graph G1 has a mismatch of a 1-bit resolution as compared with the graph G3. However, in graph G2, according to an exemplary embodiment of the invention, mismatch is reduced by half as compared with the conventional case, graph G1.

According to an exemplary embodiment of the invention, an impedance mismatch between pull-up and pull-down resistances of a terminator is improved twice as compared with the conventional impedance control scheme, without increasing resolution. The improved mismatch characteristic provides a more precise median signal as compared with the conventional case, thus an adverse effect on a setup/hold window of a receiver is reduced. By employing an exemplary embodiment of the invention in a semiconductor device or in a semiconductor memory device such as an SRAM (Static Random Access Memory), etc., an operating performance of the device is improved without lowering an impedance detection resolution.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. An impedance control circuit in a semiconductor device, comprising: an impedance detector for outputting a first output value to a detection pad connected between an external determination resistor and a pull-up transistor array in response to a pull-up control code data, and outputting a second output value to a first resistance divider terminal commonly connected between a pull-up and pull-down transistor array of a first pull-up and pull-down transistor array pair in response to the pull-up control code data and a pull-down control code data; an output driver comprising: a second pull-up and pull-down transistor array pair; and a mismatch compensating unit, wherein the second array pair includes a plurality of pull-up transistors and a plurality of pull-down transistors, wherein each of the pull-up transistors is connected in series to a different one of the pull-down transistors, wherein the pull-up transistors are connected in parallel to one another, wherein the pull-down transistors are connected in parallel to one another, wherein the mismatch compensating unit is connected in parallel to a last one of the pull-up transistors or a last one of the pull-down transistors at a second resistance divider terminal between the second array pair to compensate for quantization error of the pull-up and pull-down control code data: wherein the mismatch compensating unit comprises one of a pull-up or pull-down transistor and a resistor connected between the transistor of the compensating unit and the second resistance divider terminal, the resistor having a resistance value of twice a unit resistance of the second array pair such that a mismatch between the pull-up and pull-down resistances in the second pull-up and pull-down transistor array is reduced by half a digital control resolution; and an impedance controller for performing a comparison on the first and second output values of the impedance detector to generate the pull-up and pull-down code data.

2. The circuit of claim 1, wherein the compensating unit is connected in parallel to the pull-down transistor array of the second pull-up and pull-down transistor array pair.

3. The circuit of claim 2, wherein the impedance controller selects a first code to represent a resistance value less than a reference resistance value for generating the pull-up control code data, and selects a second code to represent a resistance value greater than the reference resistance value for generating the pull-down control code data.

4. The circuit of claim 1, wherein the compensating unit is connected in parallel to the pull-up transistor array of the second pull-up and pull-down transistor array pair.

5. The circuit of claim 4, wherein the impedance controller selects a first code to represent a resistance value greater than a reference resistance value for generating the pull-up control code data, and selects a second code to represent a resistance value less than the reference resistance value for generating the pull-down control code data.

6. The circuit of claim 1, wherein, when the first and second output values individually indicate a voltage level provided by a parallel synthesis resistance value of the pull-up and pull-down transistor array of the second pull-up and pull-down transistor array pair.

7. An impedance control circuit in a semiconductor device, the circuit comprising: an impedance detector for generating a first detection voltage to a detection pad connected between an external determination resistor and a first group transistor array in response to an applied first control code data, and outputting a second detection voltage to a first resistance divider terminal commonly connected between a second and third group transistor array, in response to the first control code data and a second control code data; a terminator, which comprises a second resistance divider terminal, and a compensating unit that is connected to the second resistance divider terminal to compensate for an impedance mismatch caused by a quantization error of the first and second control code data, the second resistance divider terminal being commonly connected between a fourth and fifth group transistor array and the compensating unit, wherein the fourth and fifth group transistor array includes a plurality of pull-up transistors and a plurality of pull-down transistors, wherein each of the pull-up transistors is connected in series to a different one of the pull-down transistors, wherein the pull-up transistors are connected in parallel to one another, and wherein the pull-down transistors are connected in parallel to one another, wherein the mismatch compensating unit comprises one of a pull-up or pull-down transistor and a resistor, the resistor having a resistance value of twice a unit resistance of the fifth group transistor array such that a mismatch between pull-up and pull-down resistance in the fourth and fifth group transistor array is reduced by half a digital control resolution; and an impedance controller for performing a comparison on the first and second detection voltages of the impedance detector to generate the first and second control code data.

8. The circuit of claim 7, wherein the compensating unit of the terminator is connected in parallel to the fourth group transistor array.

9. The circuit of claim 8, wherein the impedance controller selects a first code representing a resistance value less than a reference resistance value for generating the first control code data, and selects a second code representing a resistance value greater than the reference resistance value for generating the second control code data.

10. The circuit of claim 7, wherein the compensating unit of the terminator is connected in parallel to the fifth group transistor array.

11. The circuit of claim 10, wherein the impedance controller selects a first code representing a resistance value greater than a reference resistance value for generating the first control code data, and selects a second code representing a resistance value less than the reference resistance value for generating the second control code data.

12. The circuit of claim 7, wherein, when the first and second detection voltages individually indicate a voltage level provided by a parallel synthesis resistance value of the fourth and fifth group transistor arrays.

13. An impedance control method in a semiconductor device, comprising: preparing an output driver, the output driver including an impedance detector for generating a first and a second detection voltage and a mismatch compensating unit connected in parallel with a pull-down transistor array of a commonly connected pull-up and pull-down transistor array, wherein the pull-up and pull-down array includes a plurality of pull-up transistors and a plurality of pull-down transistors, wherein each of the pull-up transistors is connected in series to a different one of the pull-down transistors, wherein the pull-up transistors are connected in parallel to one another, and wherein the pull-down transistors are connected in parallel to one another; selecting a first code representing a resistance value less than a reference resistance value for generating a pull-up control code data, and selecting a second code representing a resistance value greater than the reference resistance value for generating a pull-down control code data, so that the first and second detection voltage of the impedance detector become approximated to a predetermined reference voltage value; and using the mismatch compensating unit to reduce an impedance mismatch between the resistance values wherein the mismatch compensating unit comprises one of a pull-up or pull-down transistor and a resistor, the resistor having a resistance value of twice a unit resistance of the commonly connected pull-up and pull-down transistor array such that a mismatch between pull-up and pull-down resistances of the commonly connected pull-up and pull-down transistor array is reduced by half a digital control resolution.

14. The method of claim 13, wherein the mismatch compensating unit is connected in parallel to the pull-down transistor array.

15. An impedance control method in a semiconductor device, comprising: preparing a terminator, the terminator including an impedance detector for generating a first and second detection voltage and a mismatch compensating unit connected in parallel with a pull-up transistor array of a commonly connected pull-up and pull-down transistor array, wherein the pull-up and pull-down array includes a plurality of pull-up transistors and a plurality of pull-down transistors, wherein each of the pull-up transistors is connected in series to a different one of the pull-down transistors, wherein the pull-up transistors are connected in parallel to one another, and wherein the pull-down transistors are connected in parallel to one another; selecting a first code representing a resistance value greater than a reference resistance value for generating a pull-up control code data, and selecting a second code representing a resistance value less than the reference resistance value for generating a pull-down control code data, so that the first and second detection voltages of the impedance detector become approximated to a predetermined reference voltage value; and using the mismatch compensating unit to reduce an impedance mismatch between the resistance values wherein the mismatch compensating unit comprises one of a pull-up or pull-down transistor and a resistor, the resistor having a resistance value of twice a unit resistance of the commonly connected pull-up and pull-down transistor array such that a mismatch between pull-up and pull-down resistances of the commonly connected pull-up and pull-down transistor array is reduced by half a digital control resolution.

* * * * *